(12) United States Patent
Rayaprolu et al.

(10) Patent No.: US 11,527,294 B2
(45) Date of Patent: Dec. 13, 2022

(54) MEMORY SUB-SYSTEM SCAN

(71) Applicant: Micron Technology, Inc., Boise, ID (US)

(72) Inventors: Vamsi Pavan Rayaprolu, San Jose, CA (US); Karl D. Schuh, Santa Cruz, CA (US); Jeffrey S. McNeil, Jr., Nampa, ID (US); Kishore K. Muchherla, Fremont, CA (US); Ashutosh Malshe, Fremont, CA (US); Jiangang Wu, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 17/001,769

(22) Filed: Aug. 25, 2020

(65) Prior Publication Data
US 2022/0068406 A1 Mar. 3, 2022

(51) Int. Cl.
*G11C 16/06* (2006.01)
*G11C 16/34* (2006.01)
*G11C 16/14* (2006.01)
*G11C 29/10* (2006.01)
*G06F 12/02* (2006.01)
*G11C 16/26* (2006.01)

(52) U.S. Cl.
CPC ...... *G11C 16/3418* (2013.01); *G06F 12/0253* (2013.01); *G11C 16/14* (2013.01); *G11C 16/26* (2013.01); *G11C 29/10* (2013.01); *G06F 2212/7211* (2013.01)

(58) Field of Classification Search
CPC ....... G11C 16/26; G11C 29/52; G11C 7/1045; G11C 29/42; G11C 16/3404; G11C 7/1072
See application file for complete search history.

(56) References Cited

U.S. PATENT DOCUMENTS

| | | | |
|---|---|---|---|
| 8,849,104 B2 | 9/2014 | Eder | |
| 8,862,952 B1* | 10/2014 | Booth | G11C 16/3468 714/763 |
| 9,514,845 B1* | 12/2016 | Wu | G06F 11/1048 |
| 10,274,948 B2 | 4/2019 | Penilla et al. | |
| 2014/0137243 A1* | 5/2014 | Reutter | H04L 63/1441 726/22 |
| 2016/0110249 A1* | 4/2016 | Orme | G06F 11/1016 714/6.24 |
| 2016/0124668 A1* | 5/2016 | Inbar | G06F 12/0246 711/162 |
| 2017/0372431 A1 | 12/2017 | Perl | |
| 2020/0192791 A1* | 6/2020 | Yang | G11C 16/3431 |

* cited by examiner

*Primary Examiner* — Uyen Smet
(74) *Attorney, Agent, or Firm* — Brooks, Cameron & Huebsch, PLLC

(57) ABSTRACT

A system includes a memory device including a plurality of groups of memory cells and a processing device that is operatively coupled to the memory device. The processing device is to receive a request to determine a reliability of the plurality of groups of memory cells. The processing device is further to perform, in response to receipt of the request, a scan operation on a sample portion of the plurality of groups of memory cells to determine a reliability of the sample portion that is representative of the reliability of the plurality of groups of memory cells.

13 Claims, 7 Drawing Sheets

MEMORY SUB-SYSTEM SCAN

TECHNICAL FIELD

Embodiments of the disclosure relate generally to memory systems and more specifically relate to a memory sub-system scan.

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
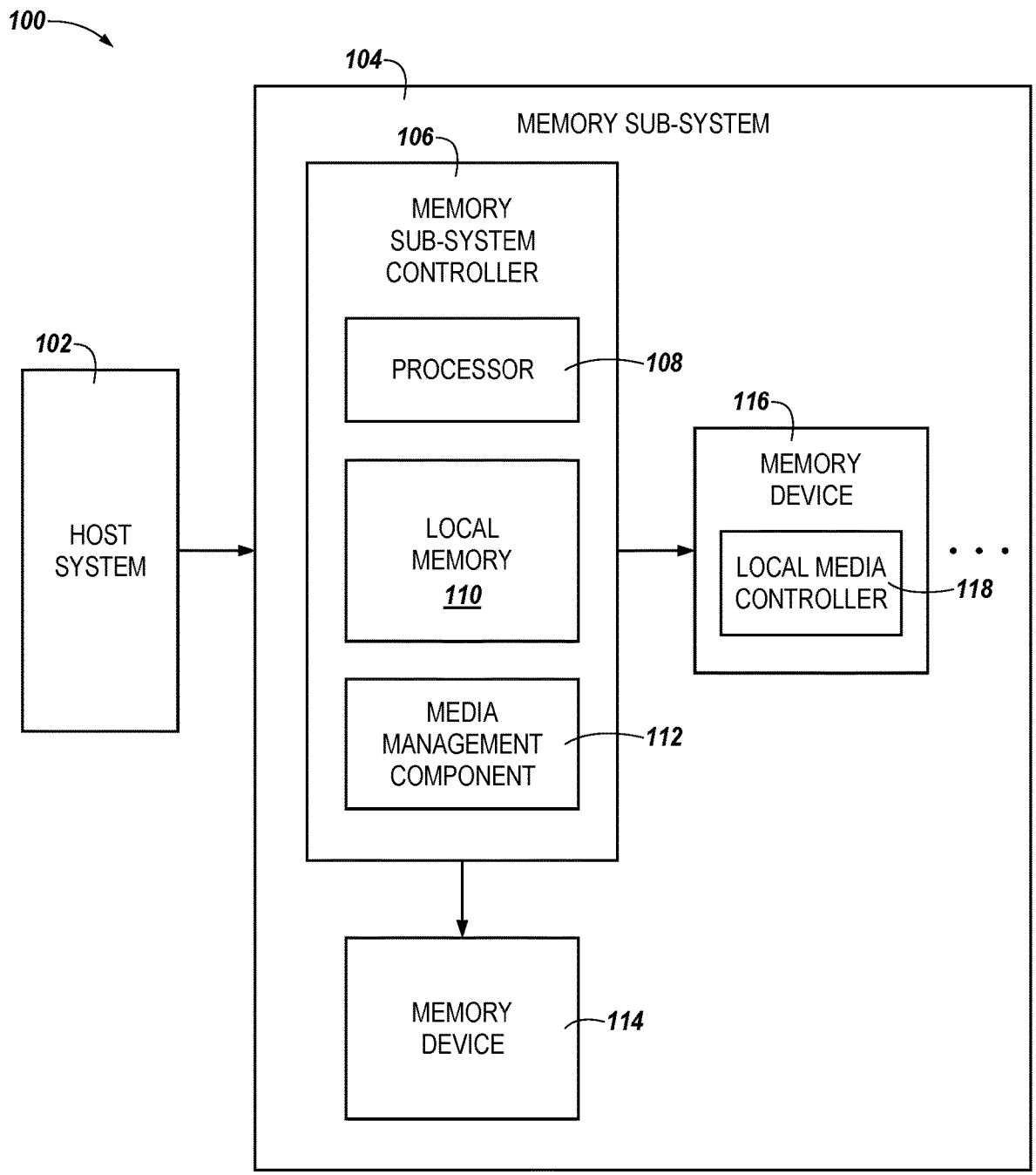
FIG. 1 illustrates an example computing system that includes a memory sub-system in accordance with some embodiments of the present disclosure.

Aspects of the present disclosure are directed to a memory sub-system scan, in particular to memory sub-systems that include a media management component that can facilitate a memory sub-system scan. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

The memory sub-system can be used for storage of data by various components of the vehicle, such as applications that are run by a host system of the vehicle. One examples of such an application is an event recorder of the vehicle. The event recorder may also be referred to as a "black box" or accident data recorder.

The emergence of autonomous vehicles, Internet of Things (IoT) and surveillance devices has resulted in a wider gap in between the total bytes written (TBW) in a useable lifetime of a memory sub-system and a user capacity of the memory sub-system. For example, the TBW to user capacity ratio for some memory systems used for such applications has increased by one to three orders of magnitude. Some autonomous vehicles require real time buffering of telemetric data such as video cameras, radar, lidar, ultra-sonic and other sensors that are necessary to playback the sequences preceding an accident. The data from various sensors sums up to a substantial throughput requirement per unit time (e.g., 1 gigabyte per second (GB/sec) sequential write throughput from a host). Upon a trigger event, a quantity of data corresponding to a predetermined playback time immediately preceding the event needs to be captured (e.g., to determine the cause of an accident). The recorded telemetric sensor data corresponding to the predetermined playback time can be referred to as a "snapshot". An event recorder is one such application in where the user capacity requirement could be as low as one hundred and twenty-eight (128) GB, but the TBW requirement could be as high as hundreds of Peta Bytes. The examples of values given are not limiting but highlight the relative difference between the requirements for capacity and TBW. An event recorder may need to store at least a few, most recent snapshots.

The memory sub-system of the event recorder can be scanned for checking a data reliability (how reliable are data stored in a memory cell) of data stored in the memory sub-system. Since scanning can exhaust processing/memory resources of the memory sub-system, it can be desired to reduce a degree of scanning to the extent that the scanning with the reduced degree does not substantially harm a reliability of a result of the scanning. Often, however, an unpredictable and/or irregular manner at which the memory sub-system of the event recorder operates can make it difficult to deterministically predict how far a degree of the scanning can be reduced without substantially harming the reliability of the result of the scanning.

Aspects of the present disclosure address the above and other deficiencies by having a memory sub-system that utilizes a component included in the memory sub-system to perform a scan operation with a reduced degree, which can still correctly assess a data reliability (alternatively referred to as "reliability") of the memory sub-system through the scan operation. The reduced degree can be determined based on known information of the memory sub-system, such as patterns associated with program/erase cycles of the memory sub-system, and/or a known reliability characteristic of a memory portion of the memory sub-system. For example, a reliability characteristic of a memory portion can be known based on its geographical characteristic within a memory die and/or when indicated by a manufacturer of the memory portion. Such information can be further utilized to perform a scan operation only on a sample memory portion with a result of the scan operation being representative of a remaining memory portion as well and/or perform a scan operation at a different rate based on a reliability characteristic of a respective memory portion.

FIG. 1 illustrates an example computing system 100 that includes a memory sub-system 104 in accordance with some embodiments of the present disclosure. The memory sub-system 104 can include media, such as one or more volatile memory devices (e.g., memory device 114), one or more non-volatile memory devices (e.g., memory device 116), or a combination of such.

A memory sub-system 104 can be a storage device, a memory module, or a hybrid of a storage device and memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), IoT enabled device, embedded computer (e.g., one included in a vehicle, industrial equipment, or a networked commercial device), or similar computing system that includes memory and a processing device.

The computing system 100 includes a host system 102 that is coupled to one or more memory sub-systems 104. In some embodiments, the host system 102 is coupled to different types of memory sub-systems 104. FIG. 1 illustrates one example of a host system 102 coupled to one memory sub-system 104. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

In at least one embodiment, the host system 102 is a computing device that controls a vehicle, such as an autonomous vehicle, and the memory sub-system 104 is an SSD that provides event recorder storage for the vehicle. For example, the memory sub-system 104 can store time based telemetric sensor data for the vehicle.

The host system 102 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access components (e.g., memory devices 116) when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be a logical block address (LBA), which can include or be accompanied by a partition number. The logical address information is the location the host system associates with the host data. The logical address information can be part of metadata for the host data. The LBA can also correspond (e.g., dynamically map) to a physical address, such as a physical block address (PBA), that indicates the physical location where the host data is stored in memory.

The memory devices 114, 116 can include any combination of the different types of non-volatile memory devices and/or volatile memory devices. The volatile memory devices (e.g., memory device 114) can be, but are not limited to, random access memory (RAM), such as dynamic random-access memory (DRAM) and synchronous dynamic random access memory (SDRAM).

Some examples of non-volatile memory devices (e.g., memory device 116) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 114 and 116 can include one or more arrays of memory cells. One method of operating a memory cell includes storing one-bit per cell, which is referred to as a single level cell (SLC). The "level" refers to the quantity of states to which the cell is programed, other than an erased state (level). An SLC can be programmed to one level other than the erased level. Other methods of operating memory cells include storing more than one bit per cell, such as multi-level cells (MLCs), triple level cells (TLCs), quad-level cells (QLCs), and penta-level cells (PLCs), among others. As used herein, "multi-level cells (MLCs)" refers to a memory cell that is programmable to two levels other than an erased level. In some embodiments, the non-volatile memory device 116 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the non-volatile memory device 116 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 116 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 106 (or controller 106 for simplicity) can communicate with the memory device 116 to perform operations such as reading data, writing data, erasing data, and other such operations at the non-volatile memory device 116. The memory sub-system controller 106 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processor 108 (e.g., a processing device) configured to execute instructions stored in a local memory 110. In the illustrated example, the local memory 110 of the memory sub-system controller 106 includes an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc. The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive commands or operations from the host system 102 and can convert the commands or operations into instructions or appropriate commands to achieve the desired access to the memory device 116 and/or the memory device 114. The memory sub-system controller 106 can be responsible for other operations such as wear leveling operations, garbage collection operations, error detection and/or correction operations, encryption operations, caching operations, and address translations between a logical address (e.g., LBA, namespace) and a physical address (e.g., physical block address, physical media locations, etc.) associated with the memory device 116. The memory sub-system controller 106 can further include host interface circuitry to communicate with the host system 102 via the physical host interface. The host interface circuitry can convert the commands received from the host system 102 into command instructions to access the memory device 116 and/or the memory device 114 as well as convert responses associated with the memory device 116 and/or the memory device 114 into information for the host system 102.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 106 and decode the address to access the memory device 116 and/or the memory device 114.

In some embodiments, the memory device 116 includes a local media controller 118 that operates in conjunction with memory sub-system controller 106 to execute operations on one or more memory cells of the memory device 116. An external controller (e.g., memory sub-system controller 106) can externally manage the non-volatile memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND (MNAND) device.

The memory sub-system controller 106 can also include media management component 112. Although not shown in FIG. 1 so as to not obfuscate the drawings, the media management component 112 can include various circuitry to facilitate performance of the operations described herein. For example, the media management component 112 can include a special purpose circuitry in the form of an ASIC, FPGA, state machine, and/or other logic circuitry that can allow the media management component 112 to orchestrate and/or perform the operations described herein.

In some embodiments, the memory sub-system controller 106 includes at least a portion of the media management component 112. For example, the memory sub-system controller 106 can include a processor (e.g., processing device) configured to execute instructions stored in local memory 110 for performing the operations described herein. In some embodiments, the media management component 112 is part of the host system 102, an application, or an operating system.

The media management component 112 can be configured to perform a scan operation on various components of the memory sub-system 104, such as the memory devices 114 and 116. The scan operation can be performed to determine a reliability of a sample location and/or a sample group of memory cells of, for example, the memory device 114 and 116, which can be utilized to be representative of a reliability of other locations of the memory device 114 and 116 as well. In some embodiments, the sample location/group of memory cells can be one of those locations/groups of memory cells of the memory devices known to have a reliability characteristic lower than that of other locations/groups of memory cells. As used herein, that a memory cell has "a reliability characteristic lower" than other memory cells can indicate that the memory cell having a lower reliability characteristic is known to be generally less reliable than the other memory cells. As an example, a scan operation can be performed on sample group(s) of memory cells having a particular geographical characteristic having a reliability characteristic lower than those memory cells having a different geographical characteristic. In this example, a result of the scan operation performed on the sample group(s) of memory cells can be representative of other groups of memory cells even in the absence of performance of a scan operation on the other groups of memory cells. As used herein, the term "geographical characteristic" can refer to a characteristic of a memory portion associated with its physical location within a memory die. For example, a memory portion located at edge(s) of a memory die can have a different geographical characteristic than other memory portions located at a non-edge area.

In some embodiments, a scan operation can be performed more frequently on one location of the memory devices 114 and 116 than other locations. For example, a scan operation can be performed more frequently on a particular location of the memory devices 114 and 116 indicated as having a reliability characteristic lower than other locations. As an example, a scan operation can be performed more frequently on group(s) of memory cells located on edges of a memory die (that is known to be generally less reliable than those memory cells located on a non-edge area) and/or a particular memory die indicated as being less reliable than other memory dies.

In some embodiments, a number of groups of memory cells (e.g., a number of blocks) known to have a reliability characteristic lower/worse than other groups of memory cells can be selectively distributed among a number of logical groups of memory cells (e.g., a number of segments). In this example, a scan operation can be performed only on the distributed number of blocks and a determined reliability of each block can represent/be used to indicate an overall reliability of a respective logical segment. Accordingly, in determining a reliability of each logical segment, a scan operation needs not be performed for every blocks of each segment, which reduces (simplifies) a degree of a scan operation to be performed on the memory device 116.

The media management component 112 can be further configured to perform a media management operation on various components of the memory sub-system 104, such as on the memory devices 114 and 116. The media management operation that can be performed by the media management component 112 can include a refresh operation, a folding operation, a wear-leveling operation, a garbage collection operation, or any combination thereof. As used herein, the term "folding operation" can refer to reprogramming data stored in a memory cell in an SLC mode to being stored in a memory cell in a non-SLC mode. As used herein, the term "refresh operation" can refer to moving data from one location to a different location of a memory device. In some embodiments, a refresh operation can move data to a different location with a recovered/increased reliability. A media management operation can be triggered based on a result of a scan operation. For example, the media management operation can be performed when a scan operation previously performed indicates a reliability of a particular location (to which the scan operation is performed) lower than a threshold reliability.

Figure 2:
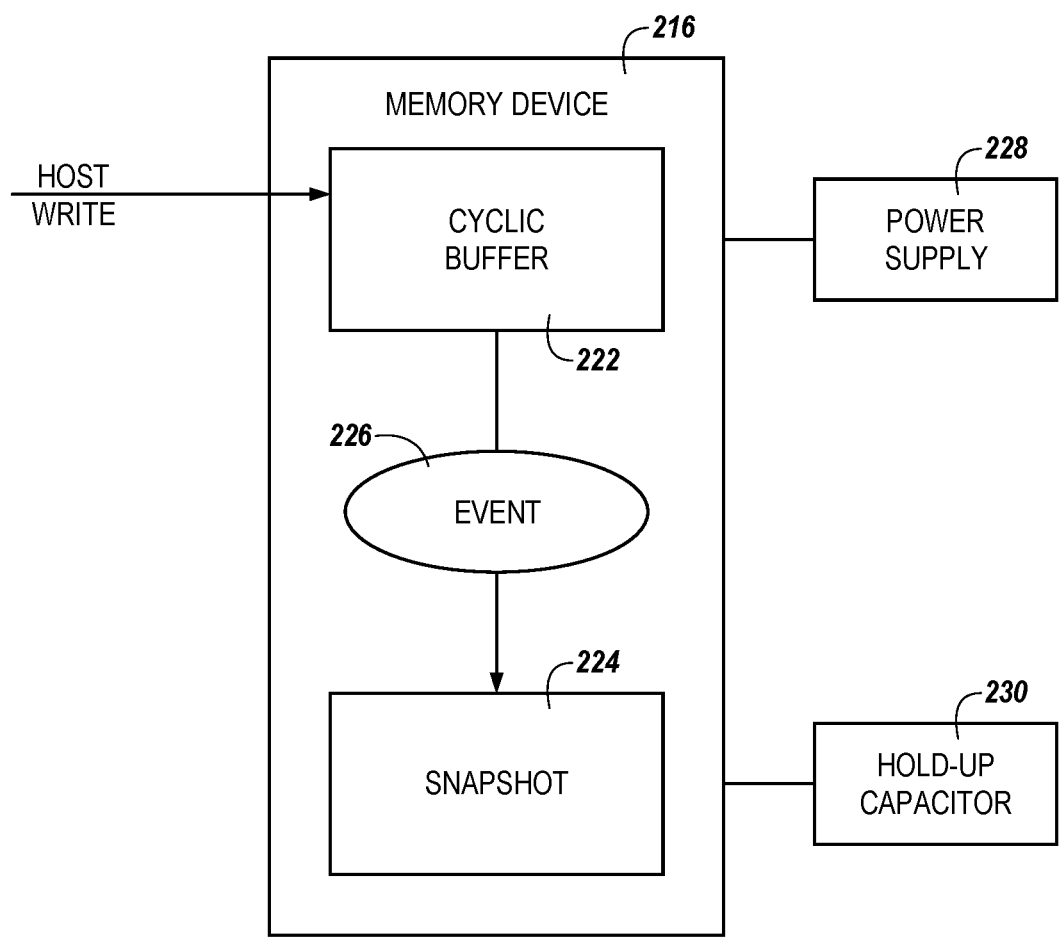
FIG. 2 illustrates an example of a memory device including a cyclic buffer and/or a snapshot within a memory device in accordance with some embodiments of the present disclosure.

FIG. 2 illustrates an example of a memory device 216 including a cyclic buffer portion 222 and a snapshot portion 224 within a memory device 216 in accordance with some embodiments of the present disclosure. The cyclic buffer portion 222 and snapshot portion 224 can be reserved portions of the memory device 216. The cyclic buffer portion 222 and snapshot portion 224 can be within a same partition or within different partitions of the memory device 216. Host data can be received by the memory sub-system. The host data can be time based telemetric sensor data from different sensors of a vehicle. The time based telemetric sensor data from the different sensors can be aggregated by the host and sent to the memory sub-system at a data rate.

The host data can be received by the memory sub-system and stored in the cyclic buffer portion 222 of the non-volatile memory device 216. As the cyclic buffer portion 222 is filled with host data, new data received from the host is stored sequentially, but data that is determined to be older than a threshold time in the cyclic buffer portion 222 can be erased or overwritten. The cyclic buffer portion 222 can therefore operate as a first-in-first-out (FIFO) buffer, where newly received data replaced the oldest data therein.

The cyclic buffer portion 222 can be coupled to the snapshot portion 224. Upon occurrence of a trigger event 226, an amount of the time based telemetric sensor data from the cyclic buffer portion 222 can be copied to the snapshot portion 224. The amount of host data corresponding to a defined period of time, which can be referred to as a playback time (e.g., 30 seconds), is referred to as a snapshot size and the data itself over that defined period of time is referred to as a snapshot. The snapshot size can be predefined for a period of time immediately preceding a trigger event. The snapshot size and/or playback time can be a predefined value programmed to the memory sub-system by a manufacturer, supplier, or user of the memory sub-system. In some embodiments, the determination that the trigger event 226 has occurred can include actuation of a trigger signal based at least in part upon received sensor information from a host that is above a threshold, such as a quantitative value. In some embodiments, the trigger event 226 can include receipt of a host-triggered signal (regardless of sensor information), which includes a circumstance where the memory device 216 is brought to a service center.

The memory device 216 can operate in a predictable manner. For example, the cyclic buffer portion 222 is operated as a FIFO buffer such that sets of data (e.g., time based telemetric sensor data) received from a host are sequentially and consistently written to the cyclic buffer portion 222 while older data are sequentially erased from the cyclic buffer portion 222. Further, for example, it is predictable that, in response to a trigger event, a particular quantity of a subset of the data stored in the cyclic buffer portion 222 and received during a predefined period of time associated with a trigger event (e.g., preceding and/or following the trigger event) are written to the snapshot portion 224. Such a predictable manner in which the memory device 216 operates enables the embodiments of the present disclosure to reduce (simplify) a degree of a scan operation to be performed on the memory device 216. For example, when it is expected/predicted that a quantity of program/erase cycles does not substantially vary among locations of the memory device 216, a result of a scan operation performed on a sample portion of the memory device 216 can indicate/represent a reliability of at least a portion of a remaining portion of the memory device 216 even without performing a subsequent scan operation on the remaining portion.

The cyclic buffer portion 222 can store significantly more data over the service life of the non-volatile memory device 216 than the snapshot portion 224. For example, the cyclic buffer portion 222 can store 3-4 orders of magnitude (1,000-10,000 times) more data than the snapshot portion 224. However, the cyclic buffer portion 222 does not have to have a larger storage capacity than the snapshot portion 224. The size (amount of memory) of the cyclic buffer portion 222 can be dependent, at least in part, on an endurance capability of the cyclic buffer portion 222. For example, if a host is expected to write 150 petabytes (PB) of data to the cyclic buffer portion 222 (TBW is 150 PB) and the endurance capability of the cyclic buffer portion 222 is 5 million PEC, then 30 GB of memory for the cyclic buffer portion 222 is sufficient to satisfy the TBW of 150 PB, provided that data stored by the cyclic buffer portion 222 is overwritten. In contrast, if the endurance capability of the cyclic buffer portion 222 is 500 thousand PEC, then 300 GB of memory for the cyclic buffer portion 222 is necessary to satisfy the TBW of 150 PB. Thus, it can be beneficial to improve (increase) an endurance capability of the non-volatile memory device 216 (e.g., an endurance capability of the cyclic buffer portion 222) so that a higher TBW requirement can be satisfied with a smaller amount of memory. Reducing the amount of memory can reduce manufacturing costs, operating costs, and/or improve performance of the non-volatile memory device 216.

The copying of a snapshot from the cyclic buffer portion 222 to the snapshot portion 224 can be powered by a power supply 228 of the memory sub-system under normal circumstances. However, copying of the snapshot from the cyclic buffer portion 222 to the snapshot portion 224 can be powered by a backup power supply, such as one or more hold-up capacitors 230 in response to a loss of system power (e.g., the power supply 228), which can be associated with the trigger event 226, such as a vehicle accident. In at least one embodiment, the loss of power from the power supply 228 can be the trigger event 226. A size and/or quantity of the hold-up capacitor(s) 230 are sufficient to provide enough power while one snapshot is being copied from the cyclic buffer portion 222 to the snapshot portion 224. As illustrated, the power supply 228 and the hold-up capacitor 230 are coupled to the memory device 216 to provide power therefor. When there is not a direct physical connection between either the power supply 228 or the hold-up capacitor 230 and the partition 220, but the power can be provided through write circuitry (not specifically illustrated).

In some embodiments, a reliability of data stored in the memory device 216 (e.g., the cyclic buffer portion 222 and/or snapshot portion 224) can be later increased/recovered, which can be actuated based at least in part upon a request from a host. This includes a circumstance where the non-volatile memory device 216 is brought to a service center and provided recovery of the reliability.

Figure 3:
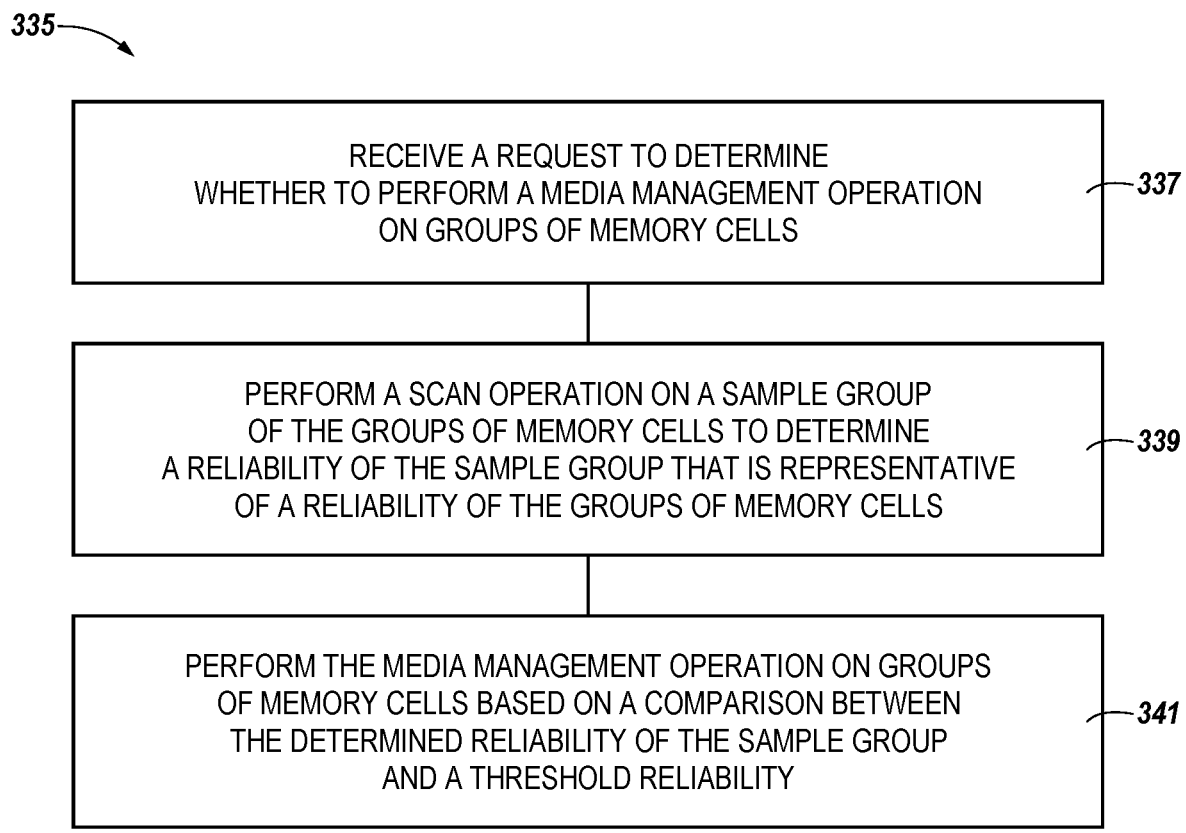
FIG. 3 is a flow diagram of an example method for scanning a memory sub-system in accordance with some embodiments of the present disclosure.

FIG. 3 is a flow diagram of an example method 335 for scanning a memory sub-system in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, media management component 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 337, a request to determine whether to perform a media management operation on groups of memory cells (e.g., of the non-volatile memory device 216 illustrated in FIG. 2) can be received. In some embodiments, a group of memory cells can correspond to a superblock (e.g., superblocks 773-1, . . . , 773-P illustrated in FIG. 7) of memory cells whose memory cells are distributed over multiple memory planes and/or dies of a memory device.

At operation 339, a scan operation can be performed on a sample group of the groups of memory cells to determine a reliability of the sample group that is representative of a reliability of the groups of memory cells. In some embodiments, the sample group of memory cells can correspond to a sample one of (e.g., a group of) multiple superblocks that can be grouped to be performed a media management operation together. In this example, a result of a scan operation performed on the sample superblock can be utilized to indicate a reliability of the group of multiple superblocks. For example, a media management operation can be performed on the group of multiple superblocks based on the determined reliability of the sample superblock being below a threshold reliability.

At operation 341, the media management operation can be performed on the groups of memory cells based on a comparison between the determined reliability of the sample group and a threshold reliability. For example, the media management operation can be performed on the groups of memory cells in response to the determined reliability of the sample group being below a threshold reliability. In this example, the media management operation is performed on the groups of memory cells without performing a further scan operation on a remaining portion of the groups of memory cells. Alternatively, performance of the media management operation can be skipped in response to the determined reliability of the sample group being above a threshold reliability.

The media management operation that can be performed on the groups of memory cells can include a refresh operation, a folding operation, a wear-leveling operation, a garbage collection operation, or any combination thereof. For example, data that were stored in the memory device in a single level cell (SLC) mode can be folded (e.g., as part of a folding operation) by being stored in the non-SLC mode.

Figure 4:
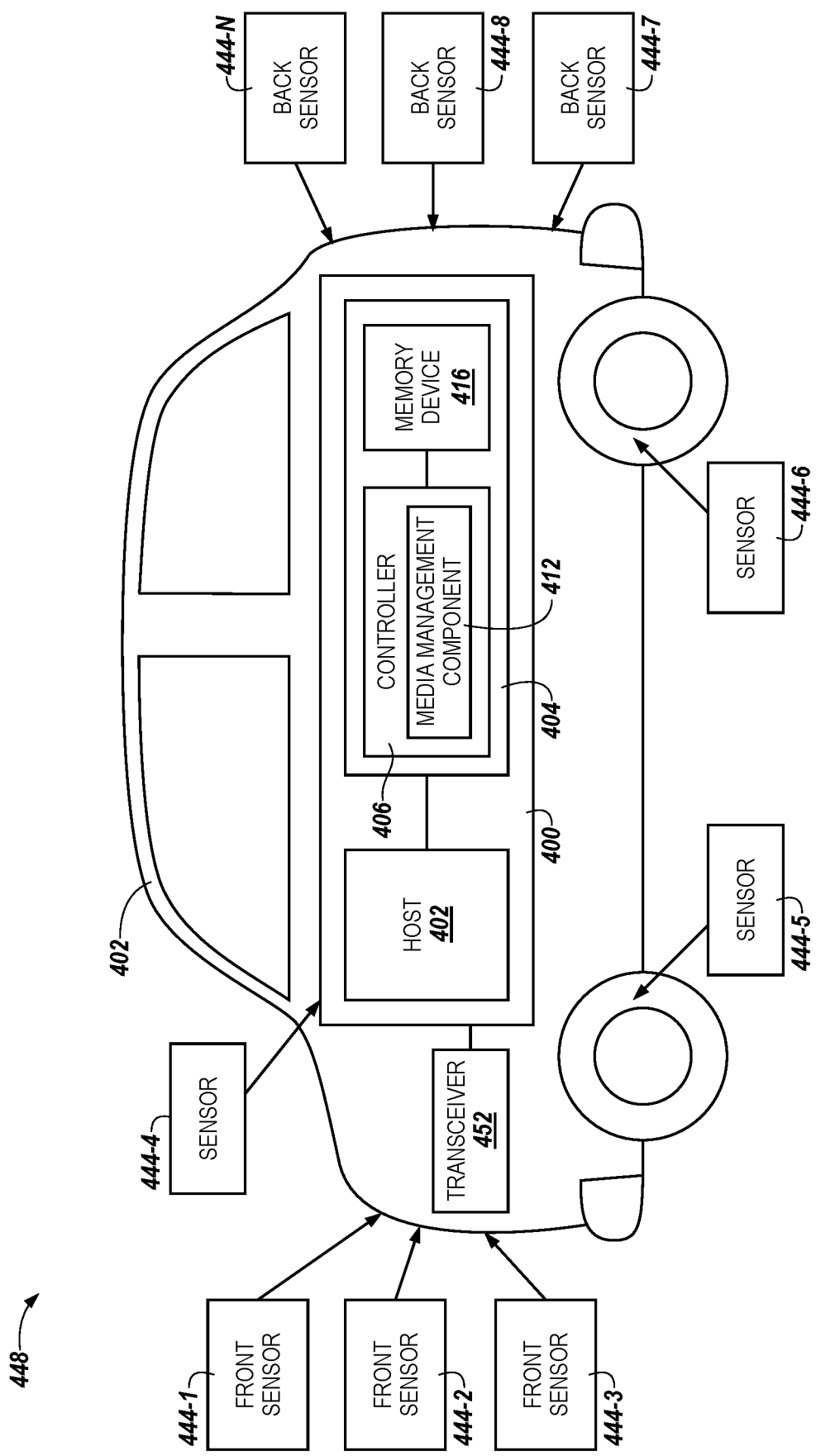
FIG. 4 illustrates an example of a system including a computing system in a vehicle in accordance with some embodiments of the present disclosure.

FIG. 4 illustrates an example of a system 448 including a computing system 400 in a vehicle 450 in accordance with some embodiments of the present disclosure. The computing system 400 can include a memory sub-system 404, which is illustrated as including a controller 406 and non-volatile memory device 416 for simplicity but is analogous to the memory sub-system 104 illustrated in FIG. 1. The controller 406 can be analogous to the memory sub-system controller 106 illustrated in FIG. 1. The controller 406 can further include a media management component 412 respectively within the controller 406. As described herein, the media management component 412, in some embodiments, can cause the controller 406 to perform operations described to be performed in association with the media management component 112.

The computing system 400, and thus the host 402, can be coupled to a number of sensors 444 either directly, as illustrated for the sensor 444-4 or via a transceiver 452 as illustrated for the sensors 444-1, 444-2, 444-3, 444-5, 444-6, 444-7, 444-8, . . . , 444-N. The transceiver 452 is able to receive time based telemetric sensor data from the sensors 444 wirelessly, such as by radio frequency communication. In at least one embodiment, each of the sensors 444 can communicate with the computing system 400 wirelessly via the transceiver 452. In at least one embodiment, each of the sensors 444 is connected directly to the computing system 400 (e.g., via wires or optical cables). As used herein, telemetric sensor data means that the data is collected by sensors 444 that are remote from the memory sub-system 404 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 450 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 444 are illustrated in FIG. 4 as including example attributes. For example, sensors 444-1, 444-2, and 444-3 are camera sensors collecting data from the front of the vehicle 450. Sensors 444-4, 444-5, and 444-6 are microphone sensors collecting data from the front, middle, and back of the vehicle 450. The sensors 444-7, 444-8, and 444-N are camera sensors collecting data from the back of the vehicle 450. As another example, the sensors 444-5, 444-6 are tire pressure sensors. As another example, the sensor 444-4 is a navigation sensor, such as a global positioning system (GPS) receiver. As another example, the sensor 444-6 is a speedometer. As another example, the sensor 444-4 represents a number of engine sensors such as a temperature sensor, a pressure sensor, a voltmeter, an ammeter, a tachometer, a fuel gauge, etc. As another example, the sensor 444-4 represents a video camera.

In some embodiments, the system 400 can be related to a braking system of the vehicle and can receive time based telemetric sensor data from to the camera sensors 444, the temperature sensors 444, and/or acoustic sensors 444. In some embodiments, the system 400 can be related to a heating/cooling system of the vehicle and can receive time based telemetric sensor data from temperature sensors 444 and/or acoustic sensors 444. In some embodiments, the system 400 can be related to an ambient noise system and can receive time based telemetric sensor data from acoustic sensors 444.

The host 402 can execute instructions to provide an overall control system and/or operating system for the vehicle 450. The host 402 can be a controller designed to assist in automation endeavors of the vehicle 450. For example, the host 402 can be an advanced driver assistance system controller (ADAS). An ADAS can monitor data to prevent accidents and provide warning of potentially unsafe situations. For example, the ADAS can monitor sensors in the vehicle 450 and take control of vehicle 450 operations to avoid accident or injury (e.g., to avoid accidents in the case of an incapacitated user of a vehicle). The host 402 can be desired to act and make decisions quickly to avoid accidents. The memory sub-system 404 can store reference data in the non-volatile memory device 416 such that time based telemetric sensor data from the sensors 444 can be compared to the reference data by the host 402 in order to make quick decisions.

Figure 5:
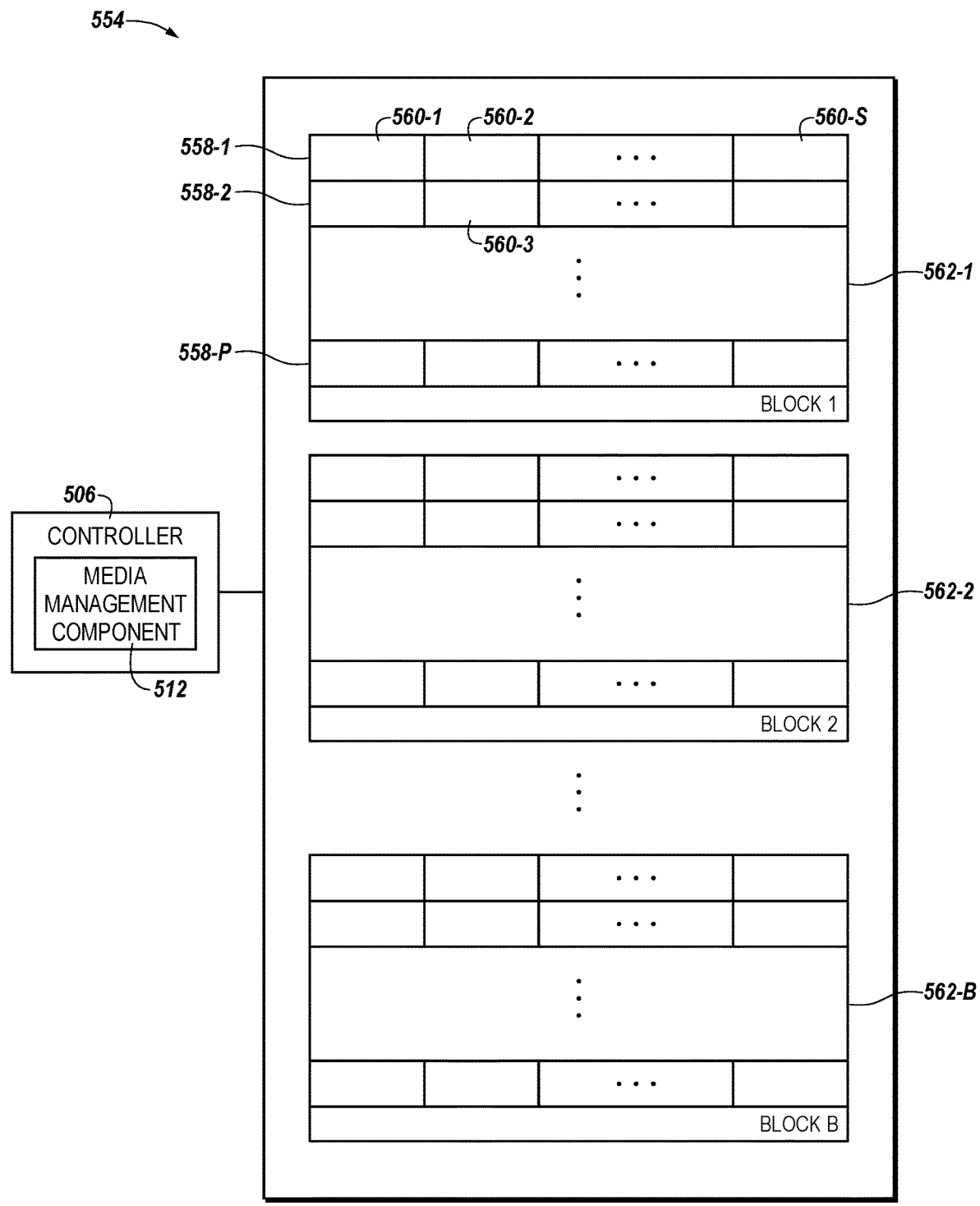
FIG. 5 illustrates a diagram of a portion of a memory array having physical blocks coupled to a controller in accordance with some embodiments of the present disclosure.

FIG. 5 illustrates a diagram of a portion of a memory array 564 having physical blocks 562 coupled to a controller 506 in accordance with some embodiments of the present disclosure. The controller 506 can be analogous to the memory sub-system controller 106 illustrated in FIG. 1. The controller 506 can further include a media management component 612. As described herein, the media management component 512, in some embodiments, can cause the controller 606 to perform operations described herein with respect to the media management component 112.

The memory array 564 can represent a memory array of the non-volatile memory device 116 in FIG. 1, for example. The memory array 564 can be, for example, a NAND flash memory array. As an additional example, memory array 564 can be an SCM array, such as, for instance, a three-dimensional cross-point (3D Cross-point) memory array, a ferroelectric RAM (FRAM) array, or a resistance variable memory array such as a PCRAM, RRAM, or spin torque transfer (STT) array, among others. Further, although not shown in FIG. 5, memory array 564 can be located on a particular semiconductor die along with various peripheral circuitry associated with the operation thereof.

As shown in FIG. 5, the memory array 564 has a number of physical blocks 562-1 (BLOCK 1), 562-2 (BLOCK 2), . . . , 562-B (BLOCK B) of memory cells. The memory cells can be operated with characteristics tailored to a performance target of the cyclic buffer or the snapshot as described herein). A number of physical blocks 562 of memory cells can be included in a plane of memory cells, and a number of planes of memory cells can be included on a die. For instance, in the example shown in FIG. 5, each physical block 562 can be part of a single die. That is, the portion of the memory array 564 illustrated in FIG. 5 can be a die of memory cells.

As shown in FIG. 5, each physical block 562 includes a number of physical rows (e.g., rows 558-1, 558-2, . . . , 558-R) of memory cells coupled to access lines (e.g., word lines). Further, although not shown in FIG. 5, the memory cells can be coupled to sense lines (e.g., data lines and/or digit lines). As one of ordinary skill in the art will appreciate, each row 558 can include a number of pages of memory cells (e.g., physical pages). A physical page refers to a unit of programming and/or sensing (e.g., a number of memory cells that are programmed and/or sensed together as a functional group). In the embodiment shown in FIG. 5, each row 558 comprises one physical page of memory cells. However, embodiments of the present disclosure are not so limited. For instance, in an embodiment, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple logical pages of data (e.g., an upper page of data and a lower page of data, with each cell in a physical page storing one or more bits towards an upper page of data and one or more bits towards a lower page of data).

As shown in FIG. 5, a row 558 of memory cells can comprise a number of physical sectors 560-1, 560-2, . . . , 560-S (e.g., subsets of memory cells). Each physical sector 560 of cells can store a number of logical sectors of data. Additionally, each logical sector of data can correspond to a portion of a particular page of data. As an example, one logical sector of data stored in a particular physical sector can correspond to a logical sector corresponding to one page of data, and the other logical sector of data stored in the particular physical sector can correspond to the other page of data. Each physical sector 560, can store system data, user data, and/or overhead data, such as error correction code (ECC) data, LBA data, and metadata.

In some embodiments, a scan operation can be performed more frequently on those groups of memory cells located on edges of a memory die (e.g., memory die 554) than on those groups of memory cells located on a non-edge area of the memory die. For example, a scan operation can be performed on the physical sector 560-1 (located on an edge of the memory die 554) at a higher rate than on the physical sector 560-3 (located on a non-edge area of the memory die 554). In some embodiments, a scan operation performed on a group of memory cells located on an edge of a memory die can further indicate/represent a reliability of other groups of memory cells on the same memory die. For example, whether to perform a media management operation on physical sectors of memory cells including sectors 560-1, . . . , 560-S (as well as the sector 560-3) can be determined based on a result of a scan operation performed on a sample sector located on an edge of the memory die 554, such as at least one of physical sectors 560-1 and 560-2 (without performing a scan operation on the physical sector 560-3).

Figure 6:
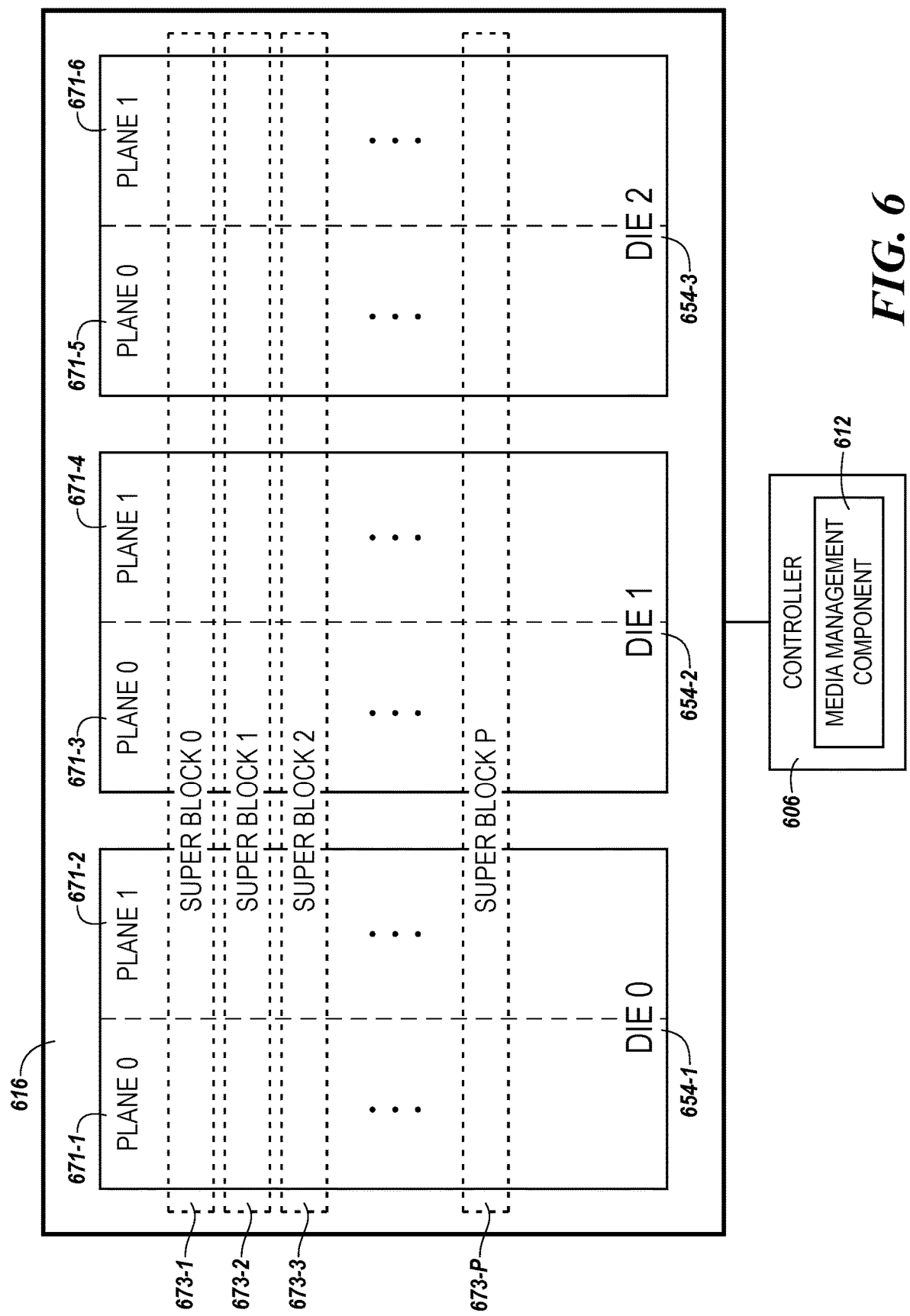
FIG. 6 illustrates a diagram of a portion of a memory array having superblocks in accordance with some embodiments of the present disclosure.

FIG. 6 illustrates a diagram of a number of memory dies 654 having superblocks 673 in accordance with some embodiments of the present disclosure. Each memory die 654-1, 654-2, and 654-3 can correspond to the memory array/die 554 of FIG. 5 and are located on a memory device 616 (analogous to the memory device 116 illustrated in FIG. 1) that is coupled to a controller 606. The controller 606 can be analogous to the memory sub-system controller 106 illustrated in FIG. 1. The controller 606 can further include a media management component 612. As described herein, the media management component 612, in some embodiments, can cause the controller 606 to perform operations described herein with respect the media management component 112, such as a media management operation.

Each memory die 654-1, 654-2, and 654-3 can include multiple planes. As illustrated in FIG. 6, for example, the memory die 654-1 includes two planes 671-1 (PLANE 0) and 671-2 (PLANE 1); the memory die 654-2 includes two planes 671-3 (PLANE 0) and 671-4 (PLANE 1); and the memory die 654-3 includes two planes 671-5 (PLANE 0) and 671-6 (PLANE 1), although each memory die is not limited to a particular number of planes it can include.

As used herein, the term "superblock" can refer to a group of memory cells whose memory cells are distributed over multiple planes of a memory die and/or multiple memory dies. For example, as illustrated in FIG. 6, memory cells of each of the superblocks 673-1 (SUPERBLOCK 0), 673-2 (SUPERBLOCK 1), 673-3 (SUPERBLOCK 2), and 673-P (SUPERBLOCK P) are distributed over a respective portion of the planes 671-1 and 671-2 of the memory die 654-1, the planes 671-3 and 671-4 of the memory die 654-2, and the planes 671-5 and 671-6 of the memory die 654-3, as illustrated in FIG. 6. Although three dies are illustrated in FIG. 6, a superblock is not limited to a particular number of dies over which memory cells of the superblock can be distributed.

In some embodiments, an erase operation, can be performed concurrently on multiple blocks of a superblock. Alternatively speaking, multiple blocks that form a same superblock can be erased substantially simultaneously. Similarly, a write and/or read operation can be performed concurrently on pages of a superblock. Alternatively speaking, multiple pages that form a same superblock can be written and/or read substantially simultaneously.

In some embodiments, whether to perform a media management operation on a group (e.g., segment) of multiple superblocks can be determined based on a result of a scan operation performed on a sample portion (e.g., single superblock) of the group. Although embodiments are not so limited, the sample portion can correspond to a single superblock of the group. In this example, a scan operation can be performed on a sample superblock only (without being performed on remaining superblocks of the group) and a reliability of the sample superblock determined from performance of the scan operation can be utilized to determine whether to perform a media management operation on the group of multiple super blocks. Accordingly, a reliability of a sample superblock can be representative of a reliability of group of multiple superblocks.

In some embodiments, a scan operation can be performed with different frequencies on respective locations of memory dies (e.g., memory dies 654-1, 654-2, and 654-3) based on known information associated with reliability characteristics of respective locations of the memory dies. For example, a particular location within a memory die and/or among memory dies can be indicated as having a reliability characteristic lower (tend to be less reliable) than other locations such that a scan operation can be performed more frequently on the particular location. The particular location can correspond to a particular memory die that is indicated by a manufacturer (e.g., of a memory die) as having a lower reliability characteristic and/or memory cells (e.g., of pages/blocks) that are located on edges of a memory die that is known to generally have a lower reliability characteristic. As an example, when a memory die 654-2 can be indicated (by a manufacturer of memory die 654-2) as having a lower reliability characteristic than memory dies 654-1 and 654-3, a scan operation can be performed on the memory die 654-2 at a higher rate (e.g., more frequently) than on the memory dies 654-1 and 654-3. In another example, a scan operation can be performed on a memory portion located on at least one of edges of memory dies 654-1, 654-2, and/or 654-3 at a higher rate (e.g., more frequently) than other memory portions of memory dies 654-1, 654-2, and/or 654-3.

Figure 7:
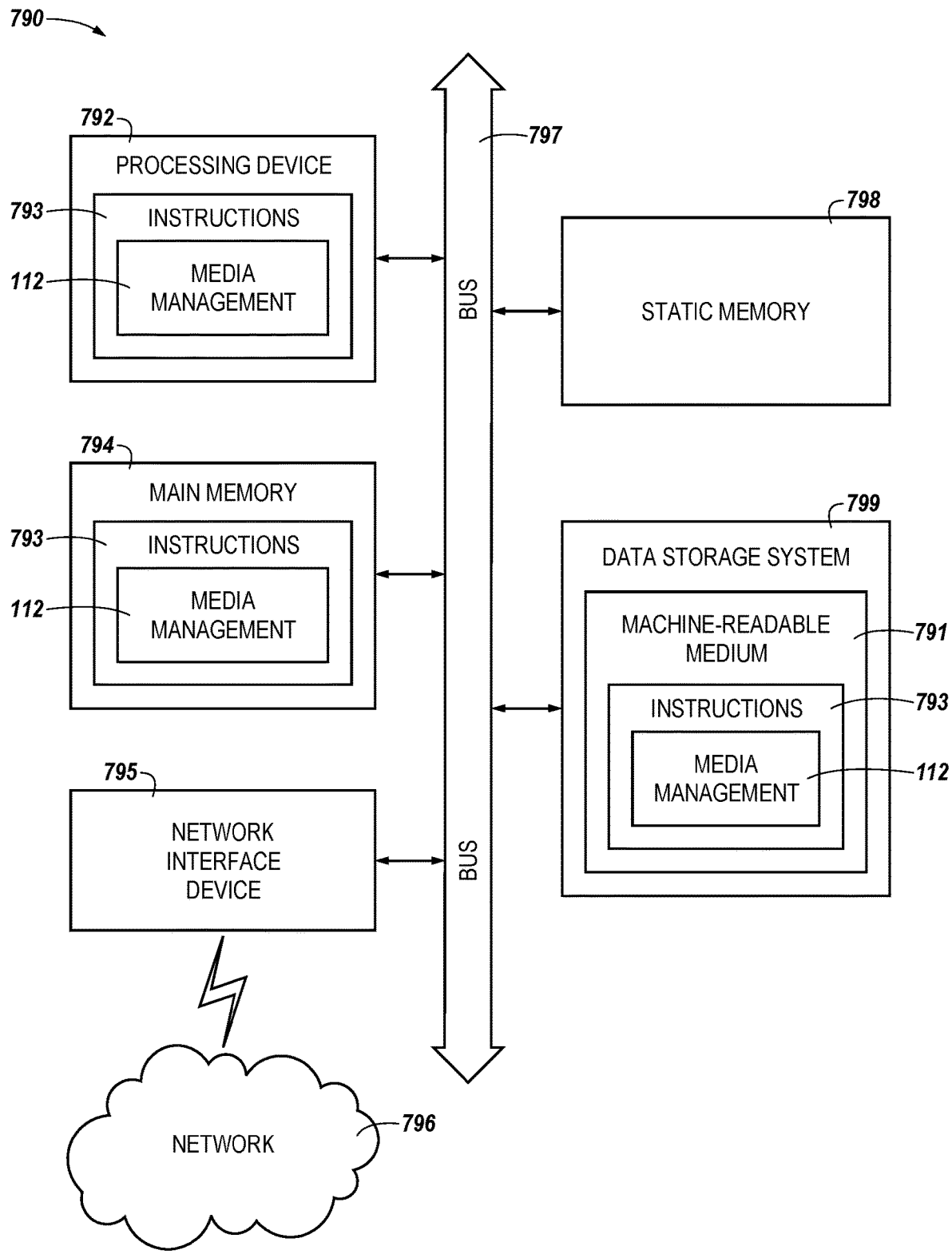
FIG. 7 is a block diagram of an example computer system in which embodiments of the present disclosure may operate.

FIG. 7 illustrates an example machine of a computer system 790 within which a set of instructions, for causing the machine to perform one or more of the methodologies discussed herein, can be executed. In some embodiments, the computer system 790 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to execute an operating system to perform operations corresponding to the media management component 112 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 790 includes a processing device 792, a main memory 794 (e.g., read-only memory (ROM), flash memory, dynamic random access memory (DRAM) such as synchronous DRAM (SDRAM) or Rambus DRAM (RDRAM), etc.), a static memory 798 (e.g., flash memory, static random access memory (SRAM), etc.), and a data storage system 799, which communicate with each other via a bus 797.

The processing device 792 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 792 can also be one or more special-purpose processing devices such as an application specific integrated circuit (ASIC), a field programmable gate array (FPGA), a digital signal processor (DSP), network processor, or the like. The processing device 792 is configured to execute instructions 793 for performing the operations and steps discussed herein. The computer system 790 can further include a network interface device 795 to communicate over the network 796.

The data storage system 799 can include a machine-readable storage medium 791 (also known as a computer-readable medium) on which is stored one or more sets of instructions 793 or software embodying one or more of the methodologies or functions described herein. The instructions 793 can also reside, completely or at least partially, within the main memory 794 and/or within the processing device 792 during execution thereof by the computer system 790, the main memory 794 and the processing device 792 also constituting machine-readable storage media. The machine-readable storage medium 791, data storage system 799, and/or main memory 794 can correspond to the memory sub-system 110 of FIG. 1.

In one embodiment, the instructions 793 include instructions to implement functionality corresponding to a media management component (e.g., media management component 112 of FIG. 1). While the machine-readable storage medium 791 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A system, comprising:
a memory device comprising a plurality of selected sample groups of memory cells known to be less reliable than other groups of memory cells of the memory device and that are selectively distributed among a number of logical segments of the memory device, wherein:
the plurality of selected sample groups comprise memory cells of a number of first rows, while the other groups comprise memory cells of a number of second rows that is different than the number of first rows; and each of the number of logical segments comprises memory cells of a respective one of the number of first rows and a respective one of the number of second rows; and
a processing device, operatively coupled to the memory device, to:
receive a request to determine a reliability of the number of logical segments of the memory device;
perform, in response to receipt of the request, a scan operation on the plurality of selected sample groups that are representative of respective reliabilities of the number of logical segments and to determine the respective reliabilities of the number of logical segments;
perform, based at least in part on the scan operation performed on the plurality of selected sample groups, a media management operation at least on the plurality of selected sample groups of memory cells as well as on the other groups of memory cells of the number of logical segments.

2. The system of claim 1, wherein the processing device is to determine whether to perform the media management operation on the number of logical segments based on a comparison between the determined reliability of a respective one of the plurality of selected sample groups and a threshold reliability.

3. The system of claim 2, wherein the processing device is to determine whether to perform the media management operation on the number of logical segments without performing a scan operation on a remaining portion of a respective one of the number of logical segments.

4. The system of claim 1, wherein:
each one of the number of logical segments comprises a plurality of groups of memory cells corresponding a superblock whose memory cells are distributed over multiple memory dies of the memory device; and
wherein the processing device is to indicate the reliability of the superblock based on the reliability of a respective one of the plurality of selected sample groups.

5. The system of claim 1, wherein:
each logical segment of the number of segments comprises memory cells of multiple memory dies;
a respective one of the plurality of selected sample groups corresponding to each logical segment is located in one of the multiple memory dies; and
wherein the processing device is to indicate the reliability of the multiple memory dies of a respective one of the number of logical segments based on a reliability of a sample memory die.

6. The system of claim 1, wherein:
each logical segment comprises a plurality of groups of memory cells including a respective one of the plurality of selected sample groups of memory cells; and
each one of the plurality of selected sample groups of a respective logical segment has a geographical characteristic different than a remaining group of the plurality of groups of the respective logical segment.

7. The system of claim 1, wherein the processing device sequentially and consistently receives a plurality sets of data, wherein each set of the plurality sets of data is received in a respective one of a plurality of consecutive and predefined periods of time.

8. The system of claim 7, wherein the processing device is further to:
sequentially write the received data to the memory device; and
erase telemetric sensor data that is determined to be older than a threshold time.

9. A method, comprising:
receiving a request to determine whether to perform a media management operation on a number of logical segments of a memory device, wherein the memory device comprises a plurality of selected sample groups of memory cells known to be less reliable than other groups of memory cells of the memory device and that are selectively distributed among the number of logical segments of the memory device, and wherein:
the plurality of selected sample groups comprise memory cells of a number of first rows, while the other groups comprise memory cells of a number of second rows that is different than the number of first rows; and
each of the number of logical segments comprises memory cells of a respective one of the number of first rows and a respective one of the number of second rows;
performing a scan operation on a plurality of selected sample groups that are representative of respective reliabilities of the number of logical segments and to determine the respective reliabilities of the number of logical segments; and
performing the media management operation on memory cells corresponding to the respective one of the number of first rows and one of the number of second rows of at least one of the number of logical segments based on a comparison between a respective one of the determined reliabilities of the number of logical segments and a threshold reliability.

10. The method of claim 9, further comprising performing the media management operation on the number of logical segments without performing a further scan operation on a remaining portion of a respective one of the number of logical segments.

11. The method of claim 9, further comprising performing the media management operation on the number of logical segments in response to the determined reliability of a respective sample group of the plurality of selected sample groups being below a threshold reliability.

12. The method of claim 9, further comprising skipping performance of the media management operation on the number of logical segments in response to the determined reliability of a respective sample group of the plurality of selected sample groups being above a threshold reliability.

13. The method of claim 9, further comprising:
storing data in memory cells of the number of logical segments in a single level cell (SLC) mode prior to performing the scan operation on the plurality of selected sample groups; and
folding, based on the determined reliability of a respective one of the number of logical segments, the data into the memory cells in a non-SLC mode.

* * * * *